United States Patent [19]
Merritt et al.

[11] Patent Number: 5,657,293
[45] Date of Patent: Aug. 12, 1997

[54] INTEGRATED CIRCUIT MEMORY WITH BACK END MODE DISABLE

[75] Inventors: Todd Merritt; Troy Manning, both of Boise, Id.

[73] Assignee: Micron Technology, Inc., Boise, Id.

[21] Appl. No.: 518,157

[22] Filed: Aug. 23, 1995

[51] Int. Cl.⁶ ............................................. G11C 17/16
[52] U.S. Cl. .................... 365/233.5; 365/225.7; 365/96; 365/201
[58] Field of Search .................. 365/233.5, 235, 365/238.5, 230.03, 225.7, 96, 201, 189.05, 230.08

[56] References Cited

U.S. PATENT DOCUMENTS

| | | | |
|---|---|---|---|
| 4,609,985 | 9/1986 | Dozier | 365/94 |
| 4,833,650 | 5/1989 | Hirayama et al. | 365/225.7 |
| 4,876,671 | 10/1989 | Norwood et al. | 365/233 |
| 4,990,800 | 2/1991 | Lee | 307/465 |
| 4,996,672 | 2/1991 | Kim | 365/225.7 |
| 5,110,754 | 5/1992 | Lowrey et al. | 437/57 |
| 5,148,391 | 9/1992 | Zagar | 365/96 |
| 5,159,676 | 10/1992 | Wicklund et al. | 365/238.5 |
| 5,200,652 | 4/1993 | Lee | 307/465 |
| 5,208,177 | 5/1993 | Lee | 437/47 |
| 5,233,206 | 8/1993 | Lee et al. | 257/50 |
| 5,241,496 | 8/1993 | Lowrey et al. | 365/96 |
| 5,245,577 | 9/1993 | Duesman et al. | 365/201 |
| 5,250,459 | 10/1993 | Lee | 437/52 |
| 5,257,222 | 10/1993 | Lee | 365/96 |
| 5,257,225 | 10/1993 | Lee | 365/185 |
| 5,282,158 | 1/1994 | Lee et al. | 365/96 |
| 5,301,159 | 4/1994 | Lee | 365/225.7 |
| 5,305,267 | 4/1994 | Haraguchi et al. | 365/225.7 |
| 5,315,177 | 5/1994 | Zagar et al. | 307/465 |
| 5,324,681 | 6/1994 | Lowrey et al. | 437/52 |
| 5,331,196 | 7/1994 | Lowrey et al. | 257/259 |
| 5,331,593 | 7/1994 | Merritt et al. | 365/185 |
| 5,335,202 | 8/1994 | Manning et al. | 365/222 |
| 5,349,566 | 9/1994 | Merritt et al. | 365/233.5 |
| 5,379,250 | 1/1995 | Harshfield | 365/105 |
| 5,388,248 | 2/1995 | Robinson et al. | 365/195 |
| 5,408,435 | 4/1995 | McClure et al. | 365/201 |
| 5,410,507 | 4/1995 | Tazunoki et al. | 365/201 |

FOREIGN PATENT DOCUMENTS 0513968  11/1992  European Pat. Off. .

*Primary Examiner*—Tan T. Nguyen
*Attorney, Agent, or Firm*—Schwegman, Lundberg, Woessner & Kluth, P.A.

[57] ABSTRACT

A memory circuit is described which can operate in one of a number of operating modes. The operating mode of the memory circuit can be changed in a non-volatile manner after the memory circuit is packaged to reduce production scrap or meet market demands. Disable circuitry is described which includes an anti-fuse that can be externally selectively blown to disable an operating mode. Control circuitry included in the memory circuit enables a new operating mode after the first operating mode is disable. A method of selectively disabling an operating mode is described. A hierarchical scheme is also described for enabling a new operating mode from a group of operating modes, for example page-mode, extended data output (EDO), or burst EDO.

17 Claims, 5 Drawing Sheets

INTEGRATED CIRCUIT MEMORY WITH BACK END MODE DISABLE

TECHNICAL FIELD OF THE INVENTION

The present invention relates generally to integrated circuit memories and in particular the present invention relates to transforming the operating mode of an integrated circuit memory after the memory circuit has been manufactured.

BACKGROUND OF THE INVENTION

Integrated circuit memories were originally designed to merely store data which could be retrieved at a later time. As such, the memories contained memory cells which were capable of being written to and read from. As the computer and communications industries continued to developed, memory circuits have evolved which contain special modes of operation. These modes have been designed to meet market demands for memory circuits which can be accessed and/or operated in a manner different than other memory circuits.

One type of memory circuit, a dynamic random access memory (DRAM), typically comprise a memory array having memory cells arranged in rows and columns. Individual memory cells can be accessed by using external address lines, and memory control circuitry is provided to control the reading and writing operations of the DRAM. Further, additional memories can be included in the integrated circuit to create a multi-port memory circuit. For example, a multi-port memory is described in U.S. Pat. No. 4,891,794 issued to Hush et al. entitled "Three Port Random Access Memory" which is assigned to the assignee of the present application and is incorporated herein by reference.

Multi-port random access memories (RAM) are substantially faster than standard RAM and commonly referred to as video random access memories (VRAM) because of their effectiveness in video systems. In its simplest form, the multi-port memory includes a DRAM array, control circuitry, and a serial access memory (SAM). The SAM is essentially a long shift register which can receive a block of data from the DRAM and serially shift the data out through a data port. The SAM can also serially shift data in through the serial port and transfer the data to the DRAM. Other multi-port memories may include a different number of serial access memories. The memory control circuitry in a multi-port memory is used to control data transfers between the DRAM and the SAM.

In addition to different memory circuits, several different modes of accessing and reading the memory cells of the DRAM have been developed, including Page Mode, Extended Data Output (EDO), and Burst EDO. While the basic hardware building blocks for each of these memories are essentially the same, subtle differences exist between the manufactured memories to provide for the different modes of operation. Further, each memory mode has a set of unique operating parameters which a packaged memory circuit must operate within. If any of these parameters are not achieved, the memory circuit must be discarded as scrap. Scrapping a memory circuit which functions properly, merely because it has a characteristic which falls outside the parameters of a specification, is economically unsatisfactory. Additionally, the market demand for memories having different modes of operation fluctuate with the demand and development of different peripheral technologies. A production decision to manufacture memory circuits to meet forecasted demands for a particular operating mode may result in memory circuits which are actually not in demand if the forecast is inaccurate. As such, the market price for the memory circuits will be reduced from what it would have been had the forecast been accurate.

For the reasons stated above, and for other reasons stated below which will become apparent to those skilled in the art upon reading and understanding the present specification, there is a need in the art for a memory circuit which can be changed after final packaging processes such that the mode of operation can be changed. This "back end" operation allows the original operating mode of the memory circuit to be disabled and a new mode enabled. Production scrap can, therefore, be reduced by changing the mode of completed memories to a mode with different operating parameters.

SUMMARY OF THE INVENTION

The above mentioned problems with reducing production scrap of integrated circuit memories and other problems are addressed by the present invention and which will be understood by reading and studying the following specification. An integrated circuit memory is described which has several different potential operating modes that can be selected after final packaging. The memory can be fabricated for use in one operating mode and then modified after packaging to change the operating mode. Circuitry is provided to selectively disable an operating mode and enable a new operating mode. A memory circuit can be changed from any operating mode to any other, including, but not limited to, EDO, burst EDO, and page mode operations.

In particular, the present invention describes an integrated circuit memory having a plurality of operating modes. The integrated circuit memory comprises a plurality of addressable memory cells for storing data, control circuitry for operating the integrated memory circuit in one of the plurality of operating modes, and a non-volatile enable circuit coupled to the control circuitry to selectively enable the one of the plurality of operating modes. The non-volatile enable circuit can comprise a selectively blowable fuse. Further, the non-volatile enable circuit can comprise a latch circuit which produces an output that indicates when an operating mode is disabled, and a fuse circuit connected to the latch circuit which produces a pre-determined output used to permanently disable the operating mode. The fuse circuit can comprise a selectively blowable anti-fuse.

In an alternate embodiment, a memory package comprises an integrated memory circuit having a plurality of operating modes comprising, addressable memory cells for storing data, control circuitry for operating the integrated memory circuit in one of the plurality of operating modes, and a non-volatile enable circuit coupled to the control circuitry to selectively enable the one of the plurality of operating modes after the integrated memory circuit has been packaged. The non-volatile enable circuit can comprise a selectively blowable fuse. Further, the non-volatile enable circuit can comprise a latch circuit which produces an output that indicates when an operating mode is disabled, and a fuse circuit connected to the latch circuit which produces a pre-determined output used to permanently disable the operating mode.

In another embodiment, an integrated circuit memory having a plurality of operating modes comprises a plurality of addressable memory cells for storing data, control circuitry for operating the integrated memory circuit in one of the plurality of operating modes, and a non-volatile enable circuit coupled to the control circuitry to selectively enable the one of the plurality of operating modes. The integrated circuit memory is manufactured by the process comprised of the steps of fabricating an integrated memory circuit having control circuitry for operating the integrated memory circuit in a plurality of operating modes, and a non-volatile enable circuit coupled to the control circuitry to selectively enable one of the plurality of operating modes. The process further includes packaging the integrated memory circuit, testing the packaged integrated memory circuit, and enabling one of the plurality of operating modes using the non-volatile enable circuit based upon the testing of the packaged integrated memory circuit.

In yet another embodiment, a method is described for changing an operating mode in an integrated memory circuit. The method comprises packaging an integrated memory circuit including control circuitry for operating the integrated memory circuit in a first mode from a plurality of modes, and a non-volatile disable circuit coupled to the control circuitry to selectively disable the first mode. The method further comprises testing the packaged integrated memory circuit, disabling the first mode using the non-volatile enable circuit based upon the testing of the packaged integrated memory circuit, and enabling a second mode from the plurality of modes.

DETAILED DESCRIPTION OF THE INVENTION

In the following detailed description of the preferred embodiment, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

This invention concerns electrical circuitry which uses voltages to represent the two binary logic levels. The words "low" and "high" in this specification refer generally to the false and true binary logic levels, respectively. Signals are generally considered active when they are high, however, an asterisk (*) following the signal name, or a bar above the signal name in this application indicates that the signal is negative or inverse logic. Negative or inverse logic is considered active when the signal is low.

Figure 1:
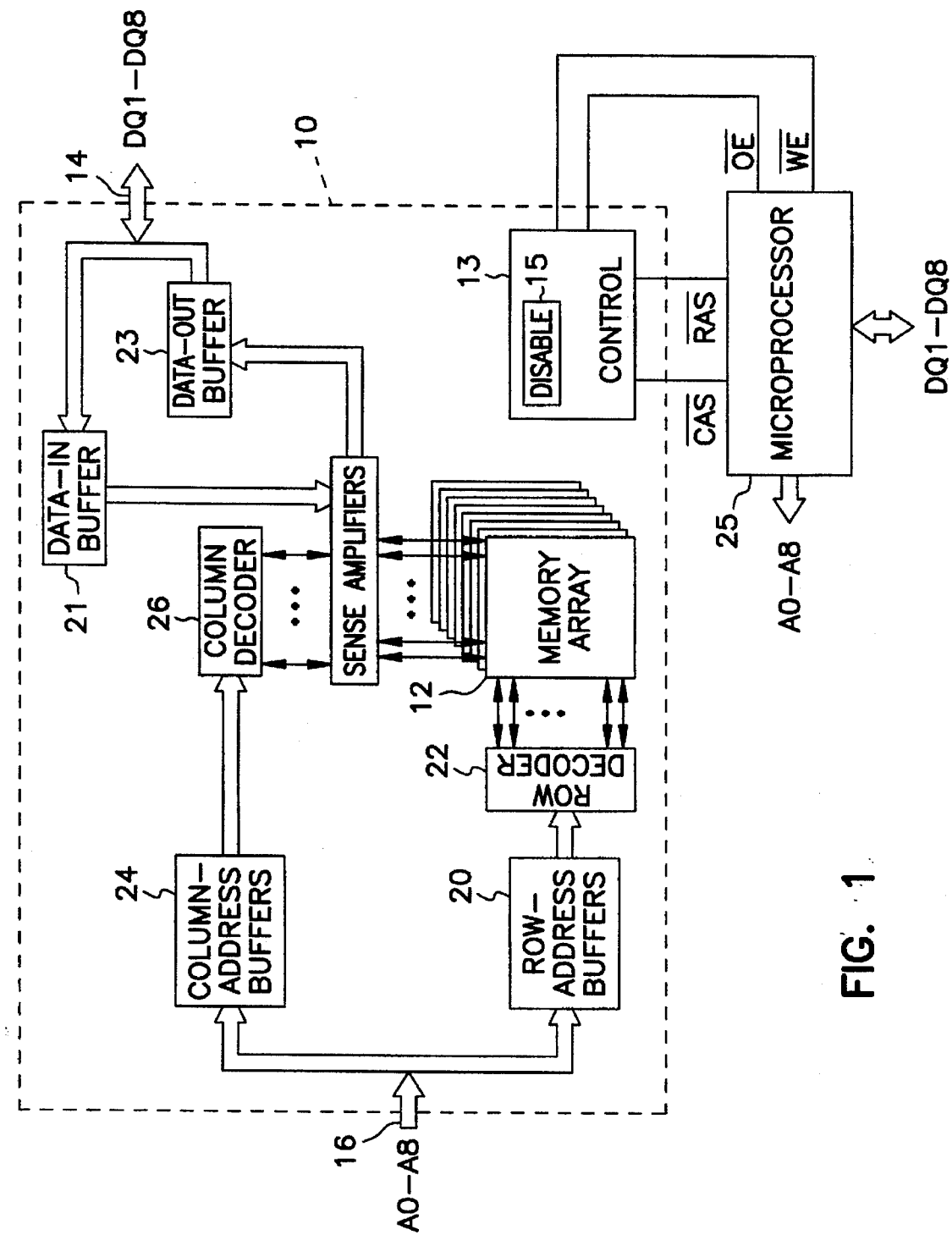
FIG. 1 is a block diagram of a DRAM incorporating the present invention.

FIG. 1 illustrates a block diagram of a DRAM 10 incorporating the present invention. Detailed elements of portions of the memory have been left out of the figure to focus on the features more directly relevant to the present invention. Such omitted detailed elements of the operation of DRAMs and their applications are known to one skilled in the art. While a DRAM is illustrated, the functions and methods described below are equally applicable to types of memory devices such as multi-port memories and static random access memories (SRAM). The memory circuit of the present invention can be a fabricated integrated circuit chip or a memory package defined herein as an encased integrated circuit chip coupled to external connectors. The memory package can be encased in any material known to one skilled in the art, for example over molding the chip and external connectors in plastic. Further, the external connectors can be any connector known to one skilled in the art, including lead frame pins or surface mount pads.

The DRAM 10 of FIG. 1 includes a DRAM array 12 which can be accessed by a microprocessor 25 through input/output connections including address lines A0–A8. In the embodiment described, the DRAM array 12 is a 512 by 512 by 8 bit array; however, the array may be any other configuration. The DRAM array 12 has a plurality of memory registers, each memory register including eight dynamic memory cells. More specifically, the DRAM array 12 includes rows and columns of eight-bit randomly addressable memory registers, with each cell of the memory register being in a different plane of the array 12. In other words, each eight-bit memory register is made up of memory cells from the eight planes having the same row and column addresses, thus forming addressable rows and columns of eight-bit memory registers.

The DRAM 12 is accessed through address bus 16, row and column address strobe signals RAS* and CAS*, write enable signal WE*, an output enable signal OE* and by using other conventional control signals (not shown) which are known to one skilled in the art. Row address latch/buffer 20 and row decoder 22 receive and decode a row address from a row address signal provided on address lines A0–A8, and address a corresponding row of the DRAM array 12. Likewise, column address latch/buffer 24 and column decoder 26 receive and decode a column address from a column address signal provided on address lines A0–A8, and address the corresponding column of the DRAM array 12.

Data bus 14 receives memory register data during a write cycle from the microprocessor 25 for writing to DRAM array 12. Data stored in the DRAM 12 can be transferred during a read cycle on bus 14. Control logic 13, including timing generation (not shown) and mode disable circuitry 15 is used to control the many available functions of the DRAM. Various control circuits and signals not detailed herein initiate and synchronize the DRAM operation as known to those skilled in the art.

Some of the inputs and outputs of DRAM 10 used to communicate with microprocessor 25 are described as follows. Write enable input (WE*) is used to select a read or write cycle when accessing the DRAM. To read the DRAM array, the WE* line is high when CAS* falls. If the WE* line is low when CAS* falls, the DRAM is written to. Row address strobe (RAS*) input is used to clock in the nine row address bits and strobe for WE*, CAS*, and DQ. In standard memories, the RAS* also acts as the master chip enable and must fall for the initiation of any DRAM array or transfer operation. Column address strobe (CAS*) input is used to clock in the nine column address bits.

Address input lines A0–A8 are used to identify a row and column address to select at least one eight-bit word or memory register out of the available memory registers of DRAM array 12, as described above. DRAM data input/output lines DQ1–DQ8 provide data input and output for the DRAM array 12. As stated above, the DRAM description has been simplified for purposes of illustrating the present invention and is not intended to be a complete description of all the features of a DRAM.

Page Mode Operation

In general, page mode operation refers to the ability to randomly access different columns of the dynamic memory array while holding one row, or "page", of the array open. That is, by addressing one row of the array, all of the columns of the array can be addressed randomly to access memory cells in the row.

Figure 2:
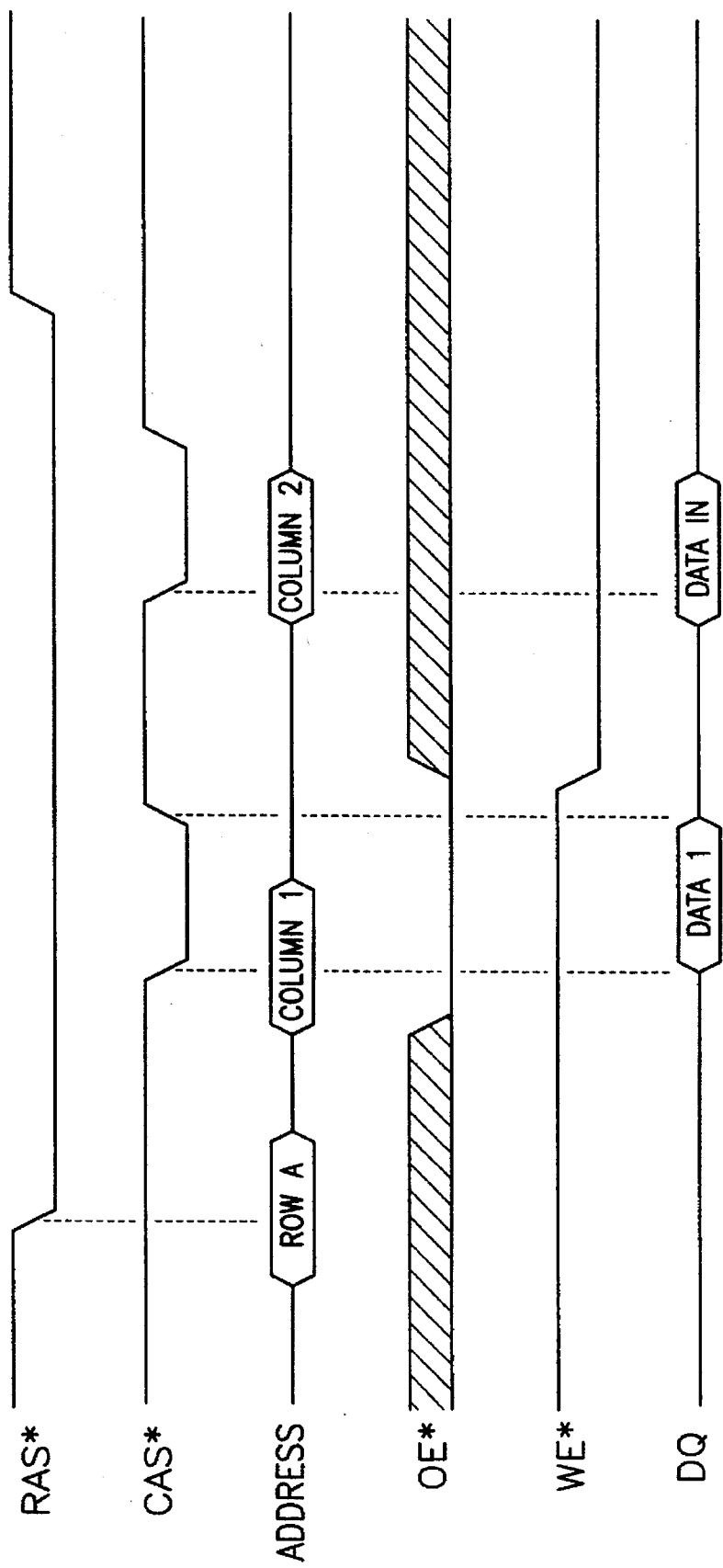
FIG. 2 is a timing diagram of a page mode operation.

FIG. 2 shows a timing diagram of a DRAM operating in a page mode. In operation, either a read or write is initiated when RAS* goes low. RAS* is used to strobe the address lines to load the address of a row to be accessed. On a CAS* cycle, when CAS* goes low, the address lines are strobed to load the address of the column to be accessed. Using the row and column addresses, specific memory cells can be accessed, as known to one skilled in the art. Specifically with reference to FIG. 2, when RAS* goes low, Row A is accessed. That is, a "page" of the memory is open as defined by all of the memory cells associated with Row A. On the first CAS* falling edge, Column 1 is addressed such that the memory cells located at the intersection of Row A and Column 1 are coupled to bus 14 for either reading or writing thereto. The state of WE* is used to determine which operation is to be performed. When CAS* falls low to address Column 1, WE* is high and indicates that a read operation is being performed. The data stored on the accessed memory cells of Column 1, therefore, is read and output on the DQ lines via the output buffer 23 while both CAS* and OE* are low. If either CAS* or OE* is high, the output buffers are mined off and the data is de-coupled from the DQ lines.

When CAS* goes low a second time during the RAS* cycle, the column address can be changed, for example to Column 2. A different set of memory cells, therefore, are coupled to the DQ lines. Because WE* is low on the falling edge of CAS*, the memory cells are coupled to the DQ lines via the input buffer 21 so that data can be written to the memory cells. The above-described page mode operation is intended to provide a general understanding of page modes in a DRAM and has been simplified to focus on some of the features of a page mode operation which are particularly different then EDO and burst EDO operations which are described below.

A more detailed description of page mode operations is provided in Micron Specialty DRAM Data Book, Pages 1—1 to 1–16, (1993) available from Micron Technology, Inc., Boise, Id., the assignee of the present invention, and is incorporated herein by reference.

Extended Data Output

Extended data output (EDO) memory circuit operation is similar to page mode but has the distinct advantage of providing data output after CAS* returns high. EDO allows CAS* precharge operations, known to one skilled in the art, to occur without turning off the output buffers. Therefore, EDO operates as any DRAM read, except the data on the DQ lines will be held valid after CAS* goes high, as long as RAS* and OE* are held low and WE* is held high. OE* can be brought low or high, and the DQ's will have valid data only when OE* is low.

Using OE*, there are two methods to disable the outputs and keep them disabled during the CAS* high time. The first method is to have OE* high when CAS* transitions high and keep OE* high for a pre-set time period. This will tri-state the DQs and they will remain tristate, regardless of OE*, until CAS* falls again. The second method is to have OE* low when CAS* transitions high. Then OE* can pulse high for a pre-set time period anytime during the CAS* high period and the DQs will tri-state and remain tri-state, regardless of OE*, until CAS* falls again. During cycles other than page mode read, the outputs are disabled at a time after RAS* and CAS* are high, or after WE* transitions low. The disable time is referenced from the rising edge of RAS* or CAS*, whichever occurs last. WE* can also perform the function of mining off the output drivers under certain conditions. See 1995 DRAM Data Book 1—1 to 1–46 (1995) available from Micron Technology, Inc., the assignee of the present invention and incorporated herein by reference, for additional details on EDO DRAMs.

Figure 3:
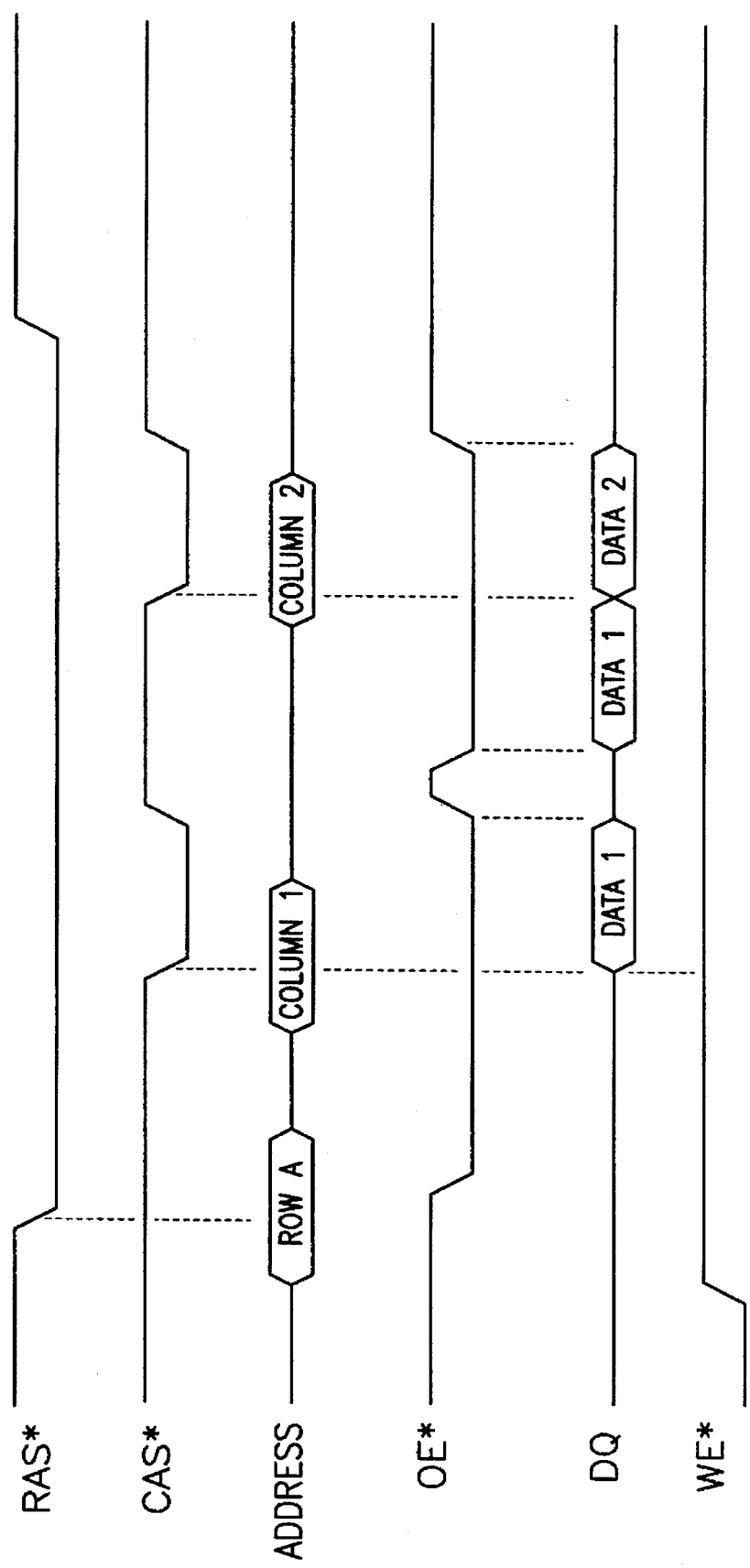
FIG. 3 is a timing diagram of an extended data output (EDO) mode operation.

FIG. 3 illustrates an EDO operation in a DRAM. When RAS* goes low, an EDO access operation is initiated and the Row A address is input from the address lines. On the first CAS* cycle Column 1 is addressed and the data stored in that column is output on the DQ lines. When CAS* returns high, the data remains available on the DQ lines until the OE* line goes high. If the OE line returns low, the data from Column 1 is again provided on the DQ lines. The second CAS* cycle loads a new column address, Column 2, and the data stored on that column is then available on the DQ lines. The above description of EDO read operations in a DRAM has been simplified to illustrate the difference between page mode operation and EDO and is not intended to be a complete description.

Burst Mode/EDO

Burst mode operation refers to the ability to provide only one column address to the memory circuit 10 via the address lines 16 and output data stored at several different column addresses. By allowing the controller 13 of the memory circuit to change column addresses automatically in a predetermined pattern, the external address lines can be switched at lower frequencies while maintaining a high frequency of data output. This is beneficial in applications where the address lines are heavily loaded.

Operating in a Burst mode, the memory receives a first column address on the address lines and increments the column address internally on successive input signals, for example CAS* cycles. The OE*, WE* and DQ lines are used to control read or write operations to the memory array during Burst mode. Further, Burst mode can be combined with EDO mode to provide a memory which has the ability to burst addresses and have extended data output.

Figure 4:
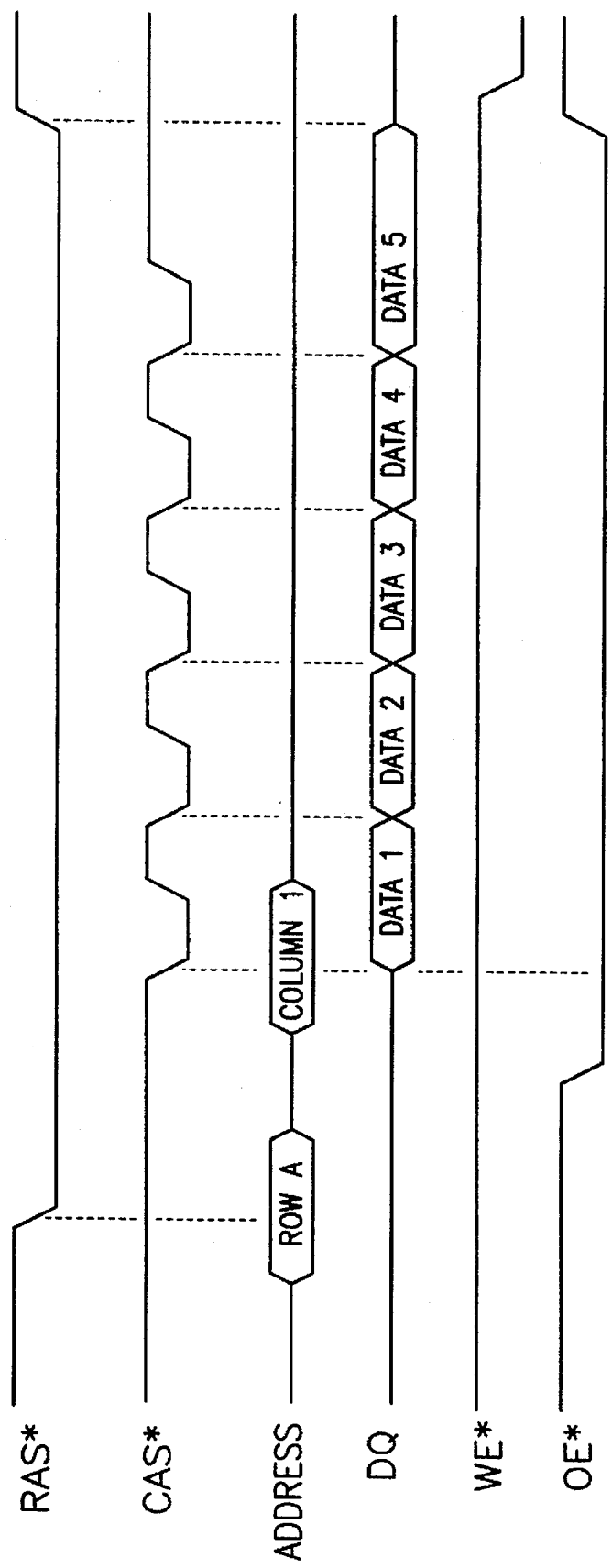
FIG. 4 is a timing diagram of a burst EDO mode operation.

FIG. 4 shows a Burst EDO (BEDO) memory where Row A is addressed on the RAS* cycle and on the first CAS* falling edge Column 1 is accessed as provided on the address lines. On successive CAS* cycles, Columns 2–5 are accessed to provide data output on the DQ lines of Data 2–Data 5. Important to BEDO operation is the burst length of the memory. Burst length is the number of CAS* cycles during which the external address lines are ignored. The burst length for the burst mode in FIG. 4 is set at a predetermined burst length of four CAS* cycles. An initial external address at the beginning of the burst length is incremented during the burst length for operation in one or more functional modes such as burst read or burst write. The burst length may be more or less than four and is only limited on the upper end by the number of column addresses in a row of the DRAM array. The BEDO operation has been described in a simplified manner to illustrate the difference between EDO and BEDO modes, and is not intended to be a complete description.

Selective Mode Operation

The three modes of operating a dynamic memory as generally described above can be provided on memory circuits which have a substantial amount of common components. However, it has been traditional to manufacture memory circuits which can be operated in only one of the modes. For example, EDO memories are fabricated with control circuitry 13 which dictates that an EDO mode is used. Further, each of the above modes have different specifications and market demands. As such, if a batch of memory circuits are fabricated for a specific mode, but fail to meet the specifications for that mode, the memory circuits are considered scrap. For example, burst EDO memories tend to have very tight timing specifications. If a batch of burst EDO memories are operational, but out of specification limits, the part must be discarded.

To reduce the adverse economic effects of discarding good memory circuits, the memory circuit of the present invention has a disable control circuit 15 which can be used to operate the memory circuit 10 in one of several different modes. Control circuitry 13 can then be used to selectively enable one of the different operating modes. As such, a batch of memory circuits can be fabricated for an intended mode and if it is desired to change the mode, a different mode can be enabled.

Figure 5:
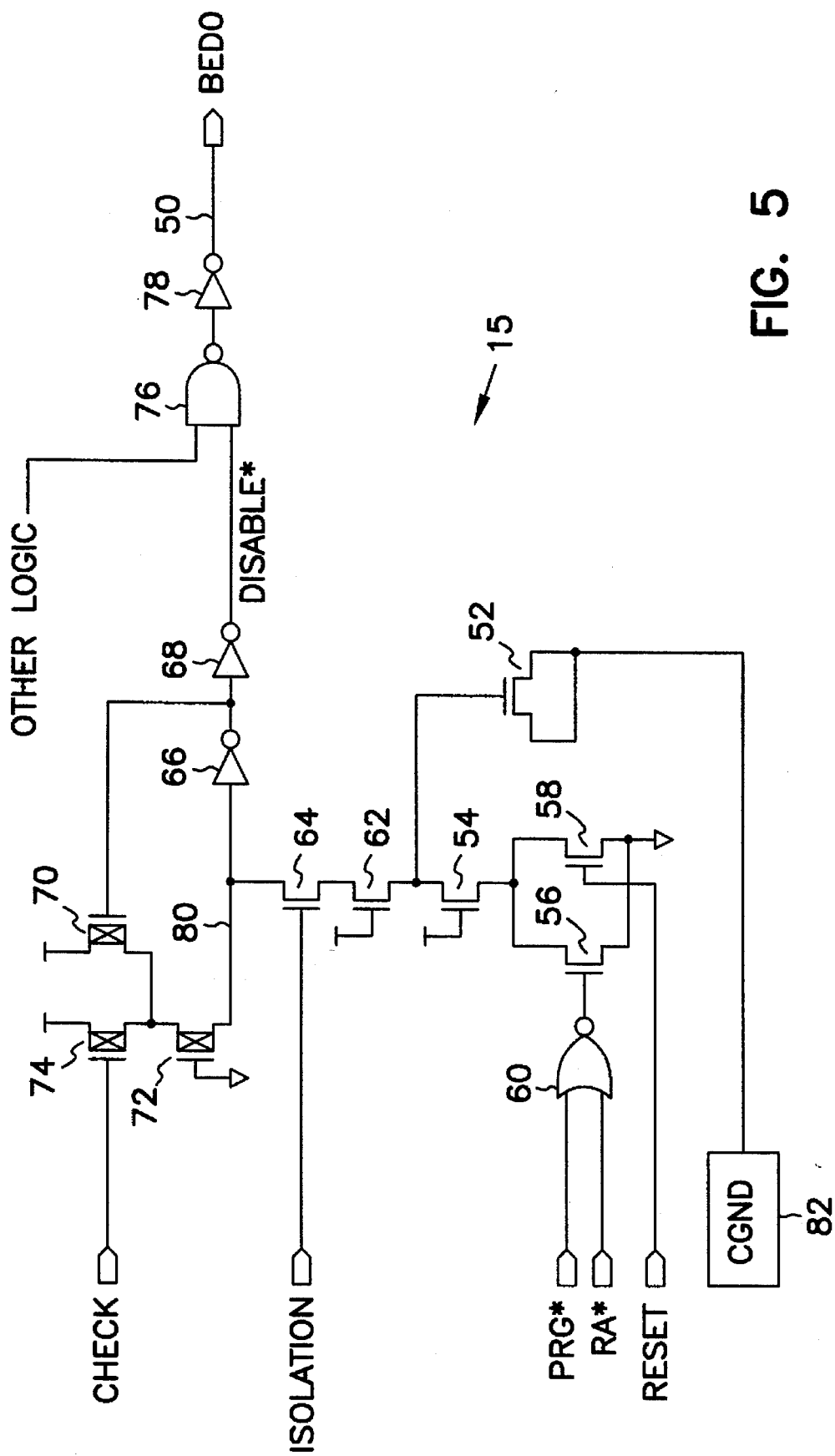
FIG. 5 is a schematic of a non-volatile disable circuit.

FIG. 5 shows one embodiment of a non-volatile disable circuit 15 used to disable a burst EDO mode. It will be understood that any disable circuit can be used and the present invention is not limited to the disable circuit described herein. The disable circuit 15 includes an anti-fuse 52 fabricated as a nitride capacitor. It will be understood that other fuse circuits can be used and the present invention is not limited to a nitride anti-fuse circuit. To disable the burst EDO mode, the BEDO output signal 50 must be low. This is accomplished by shorting the plates of the anti-fuse 52 using high voltage MOS transistors 54 and 56, and an external variable voltage source 82 (CGND). Transistors 54 and 56 are long "L" devices which can be operated at relatively high voltages. Transistors 70 and 72 are provided to latch the input to inverter 66 to a high voltage if the anti-fuse is not blown. Transistor 74 is used to activate the latch operation. That is, by lowering the gate of transistor 74 it is activated and node 80 is pulled high through transistors 74 and 72 provided transistor 64 is either tuned off, or activated and the anti-fuse 52 is not blown. If the anti-fuse is blown, node 80 will remain coupled to ground through activated transistors 64 and 62.

In operation, the anti-fuse 52 is blown by first deactivating transistor 64 to isolate the anti-fuse from node 80. The gate of transistor 58 is then pulsed high to activate the transistor and discharge the anti-fuse of any charge stored thereon. The inputs to NOR gate 60, PRG* and RA*, are then lowered to provide a high output from the NOR gate to activate transistor 56. The variable voltage source CGND 82 is then raised to a "super" voltage level such that a large potential is developed across the anti-fuse and the plates of the anti-fuse become shorted together. The super voltage is preferably 10 volts, but will be dependent upon the operating range for which the memory circuit was fabricated. As stated above, transistors 54 and 56 are long "L" devices which can operate at sufficient voltages to blow the anti-fuse without sustaining damage. After the anti-fuse is blown, the CGND line returns to a ground potential and the inputs to the NOR gate return to a high state. Transistor 64 is then activated to couple the anti-fuse to node 80.

With node 80 coupled to ground through the blown anti-fuse, the output of inverters 66 and 68 are high and low, respectively. One of the inputs to NAND gate 76 is therefore low and its output is held high. The output 50, BEDO, of inverter 78 is low such that the burst EDO mode is disabled. NAND gate 76 is provided to allow other logic circuitry to selectively disable the BEDO mode without blowing the anti-fuse. This option is particularly useful during testing of the manufactured memory circuit when the BEDO signal needs to be a temporary, or volatile, disable.

It will be recognized that transistor 74 can be activated periodically or prior to each memory access operation to check the state of the anti-fuse and insure that inverter 66 is not latched in the wrong state. This could happen when the anti-fuse is not blown and the input to inverter 66 goes low, for example in an integrated circuit start-up sequence.

A non-volatile disable circuit 15 similar to that illustrated in FIG. 5 can be provided in the control circuit 13 for each mode available in a memory circuit. A hierarchical scheme can then be used to determine which mode is to be used in a given memory circuit. For example, two separate disable circuits 15 can be provided for producing a BEDO and an EDO enable signal. If both signals are high, the memory circuit will operate in a BEDO mode. If the BEDO signal is low, the memory circuit will operate in the EDO mode. Further, if the EDO signal is low, the memory circuit will operate in a page mode. It will be appreciated that any number of modes and hierarchical schemes can be incorporated in a memory circuit without departing from the present invention.

Conclusion

A memory circuit has been described which can be operated in one of several possible modes, such as page-mode, EDO, and BEDO. The memory, therefore, can operate in different modes while maintaining the same package pinout. Disable circuitry has been described which can be initiated externally and used to disable in a non-volatile manner one mode so that a different mode can be enabled. The operating mode of the memory, therefore, can be changed after it has been packaged. A hierarchical scheme has been described to enable one mode upon the disablement of another mode.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, although an anti-fuse 52 has been described herein for disabling a memory mode, a disable circuit could be used which incorporates a fuse to produce the disable signal. Further, the disable circuit could be used to disable/enable peripheral operations such as a self-refresh function, and is not intended to be limited to a mode control. Therefore, it is manifestly intended that this invention be limited only by the claims and the equivalents thereof.

What is claimed is:

1. An integrated circuit memory having a plurality of operating modes, the integrated circuit memory comprising:
    a plurality of addressable memory cells for storing data;
    a non-volatile disable circuit to selectively disable the first one of the plurality of operating modes; and
    control circuitry coupled to the non-volatile disable circuit for operating the integrated memory circuit in one of the plurality of operating modes in response to the non-volatile disable circuit, wherein the non-volatile disable circuit comprises a selectively blowable fuse.

2. An integrated circuit memory having a plurality of operating modes, the integrated circuit memory comprising:
   a plurality of addressable memory cells for storing data;
   a non-volatile disable circuit to selectively disable a first one of the plurality of operating modes; and
   control circuitry coupled to the non-volatile disable circuit for operating the integrated memory circuit in one of the plurality of operating modes in response to the non-volatile disable circuit,
   wherein the non-volatile disable circuit comprises:
      a latch circuit which produces an output that indicates when the first one of the plurality of operating modes is disabled; and
      a fuse circuit connected to the latch circuit which produces a pre-determined output used to permanently disable the first one of the plurality operating modes.

3. The integrated circuit memory of claim 2 where the fuse circuit comprises a selectively blowable anti-fuse.

4. The integrated circuit memory of claim 2 where the fuse circuit comprises:
   a high voltage MOS transistor having its drain coupled to a low voltage line; and
   an anti-fuse electrically coupled between a variable voltage source and a source of the high voltage MOS transistor.

5. A memory package comprising:
   a packaged integrated memory circuit having a plurality of operating modes comprising;
   addressable memory cells for storing data;
   a non-volatile disable circuit to selectively disable the first one of the plurality of operating modes; and
   control circuitry coupled to the non-volatile disable circuit for operating the integrated memory circuit in one of the plurality of operating modes in response to the non-volatile disable circuit, wherein the non-volatile disable circuit comprises a selectively blowable fuse.

6. A memory package comprising:
   a packaged integrated memory circuit having a plurality of operating modes comprising;
   addressable memory cells for storing data;
   a non-volatile disable circuit to selectively disable a first one of the plurality of operating modes; and
   control circuitry coupled to the non-volatile disable circuit for operating the integrated memory circuit in one of the plurality of operating modes in response to the non-volatile disable circuit,
   wherein the non-volatile disable circuit comprises:
      a latch circuit which produces an output that indicates when the first one of the plurality of operating modes is disabled; and
      a fuse circuit connected to the latch circuit which produces a pre-determined output used to permanently disable the first one of the plurality operating modes.

7. The memory package of claim 6 where the fuse circuit comprises a selectively blowable anti-fuse.

8. The memory package of claim 6 where the fuse circuit comprises:
   a high voltage MOS transistor having its drain coupled to a low voltage line; and
   an anti-fuse electrically coupled between a variable voltage source and a source of the high voltage MOS transistor.

9. A memory having a plurality of operating modes comprising a plurality of addressable memory cells for storing data, a non-volatile disable circuit to selectively disable a first one of the plurality of operating modes, and control circuitry coupled to the non-volatile disable circuit for operating the memory in one of the plurality of operating modes in response to the non-volatile disable circuit, the memory manufactured by the process comprising the steps of:
   fabricating an integrated circuit memory having a non-volatile disable circuit to selectively disable a first one of the plurality of operating modes, and control circuitry coupled to the non-volatile disable circuit for operating the memory in one of the plurality of operating modes in response to the non-volatile disable circuit;
   packaging the integrated circuit memory; and
   programming the non-volatile disable circuit by selectively activating a fuse circuit to disable one of the plurality of operating modes.

10. A method of changing an operating mode in an integrated memory circuit, comprising the steps in the order of:
    packaging an integrated memory circuit including control circuitry for operating the integrated memory circuit in a first mode from a plurality of modes, and a non-volatile disable circuit coupled to the control circuitry to selectively disable the first mode;
    programming the non-volatile disable circuit;
    testing the packaged integrated memory circuit;
    disabling the first mode using the programmed non-volatile disable circuit. and
    enabling a second mode from the plurality of modes.

11. The method of claim 10 wherein the step of programming the non-volatile disable circuit further comprises the sub-step of:
    selectively blowing a fuse circuit to produce a pre-determined output used to permanently disable the first operating mode.

12. The method of claim 10 wherein the fuse circuit comprises an anti-fuse.

13. The method of claim 10 wherein the first mode is an extended data output (EDO) mode, and the second mode is a page mode operation.

14. The method of claim 10 wherein the first mode is an extended data output (EDO) mode, and the second mode is a burst extended data output (BEDO) mode.

15. The method of claim 10 wherein the first mode is a burst extended data output (BEDO) mode, and the second mode is a extended data output (EDO) mode.

16. An integrated circuit in memory having a plurality of operating modes, the integrated circuit memory comprising:
    a plurality of addressable memory cells for storing data;
    a non-volatile disable circuit to selectively disable a first one of the plurality of operating modes; and
    control circuitry coupled to the non-volatile disable circuit for operating the integrated memory circuit in one of the plurality of operating modes in response to the non-volatile disable circuit, wherein the non-volatile disable circuit comprises a selectively blowable anti-fuse.

17. A memory package comprising:
    a packaged integrated memory circuit having a plurality of operating modes comprising;
    addressable memory cells for storing data;

a non-volatile disable circuit to selectively disable a first one of the plurality of operating modes; and control circuitry coupled to the non-volatile disable circuit for operating the integrated memory circuit in one of the plurality of operating modes in response to the non-volatile disable circuit, wherein the non-volatile disable circuit comprises a selectively blowable antifuse.

* * * * *